United States Patent [19]

Yamauchi et al.

[11] Patent Number: 4,920,517
[45] Date of Patent: Apr. 24, 1990

[54] SEMICONDUCTOR MEMORY DEVICE HAVING SUB BIT LINES

[75] Inventors: Hiroyuki Yamauchi, Hirakata; Toshio Yamada, Sakai; Michihiro Inoue, Ikoma, all of Japan

[73] Assignee: Matsushita Electric Industrial Co., Ltd., Osaka, Japan

[21] Appl. No.: 182,895

[22] Filed: Apr. 18, 1988

Related U.S. Application Data

[63] Continuation-in-part of Ser. No. 40,471, Apr. 20, 1987, Pat. No. 4,807,194.

[30] Foreign Application Priority Data

Apr. 24, 1986 [JP] Japan .................................. 61-95364
Apr. 16, 1987 [JP] Japan .................................. 62-93604
Jul. 1, 1987 [JP] Japan .................................. 62-164544

[51] Int. Cl.$^5$ .............................................. G11C 7/00
[52] U.S. Cl. ........................................ 365/207; 365/51
[58] Field of Search .......................... 365/51, 207, 208

[56] References Cited

U.S. PATENT DOCUMENTS 4,700,328 10/1987 Burghard ............................. 365/51

Primary Examiner—Joseph A. Popek
Attorney, Agent, or Firm—Wenderoth, Lind & Ponack

[57] ABSTRACT

A dynamic random access memory which includes a memory cell array, sense amplifiers disposed at both side of the memory cell array, and sub bit lines coupled to the sense amplifiers. The sub bit lines are coupled to data busses through middle amplifiers. By use of such memory architecture, higher integration of DRAM can be realized. Also, handling of super large bit data more than 1024 bit becomes possible.

7 Claims, 18 Drawing Sheets

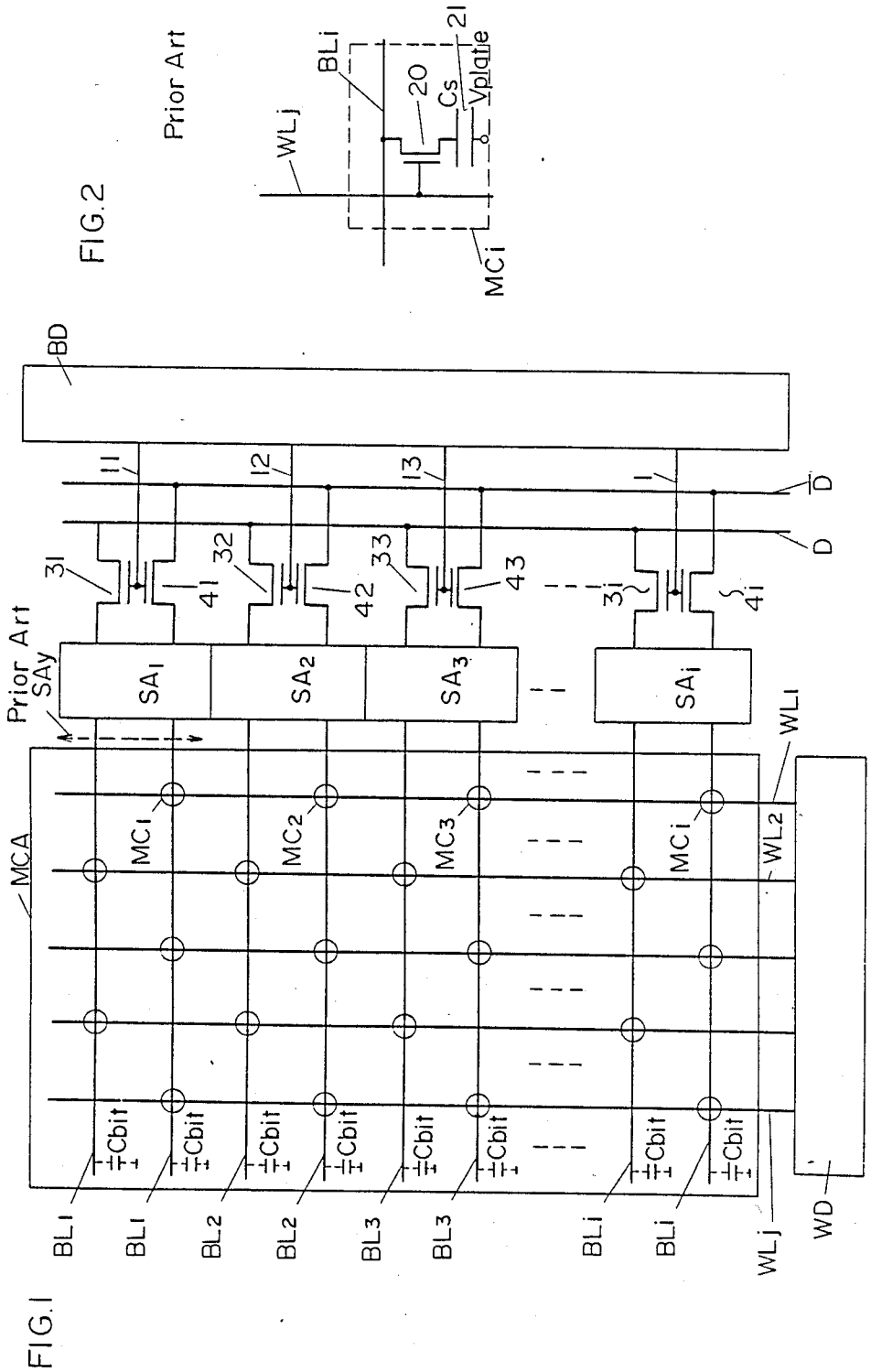

SEMICONDUCTOR MEMORY DEVICE HAVING SUB BIT LINES

This is a continuation-in-part of parent application Ser. No. 040,471, filed Apr. 20, 1987, now U.S. Pat. No. 4,807,194.

BACKGROUND OF THE INVENTION

The present invention relates to a semiconductor memory device which has sub bit lines, and more particularly to a dynamic random access memory (DRAM) whose architecture is convenient in higher integration of a memory device.

The higher integration of DRAM has been progressed rapidly. For example, the extent of integration has been doubled in three years. Such higher integration of DRAM has been realized mainly by (i) progress of super fine processing technique and (ii) increase of chip size. Another reason which can not be omitted is an improvement of memory cell structure. As a matter of fact, such improvement of memory cell structure enables higher integration of DRAM than that based upon super fine processing technique. This is clear according to the history of DRAM. First memory cell structure in the history is four (4) transistor-type cell in which four (4) MOS transistors are required to hold data of one (1) bit. Thereafter, three (3) transistor-type cell emerged, and then, after the advent of 16K bit DRAM, one (1) transistor-type cell has been mainly used to date. As apparent from the foregoing, higher integration of DRAM has been realized by an improvement of memory cell structure, i.e., reduction of the number of a transistor which forms a memory cell. In addition to that, in the course of development from 16K bit DRAM to 1M bit DRAM, high integration of DRAM has been realized by mainly, progress of super fine processing technique and improvement of layout in memory cells. After the advent of 1M bit DRAM, high integration of DRAM has been realized and will be realized by adopting unique structure of a memory cell capacitor in which a capacitance is formed in a groove vertically formed in a silicon substrate so that plane size of a capacitor can be minimized. That is, in this case, size reduction of a memory cell can be realized by three dimensionalization of a cell.

In the course of the above-stated development, there has been no substantial improvement or change as to peripheral circuits which are necessary for DRAM and depend upon memory cell pitch, e.g., sense amplifier.

Under such circumstances, higher integration of DRAM based upon improvement of memory cell structure has been progressed day by day. As a result, a gap between peripheral circuits of DRAM and memory cell pitch has been increasing.

Therefore, in the foreseeable future, there may occur a case wherein the extent of integration of DRAM is defined by peripheral circuits.

SUMMARY OF THE INVENTION

The present invention, therefore, as its principal object the provision of an improved semiconductor memory device in which peripheral circuits can readily follow further higher integration of memory cells.

This and other objects are accomplished by a semiconductor memory device according to the invention, which device includes sense amplifiers disposed at both sides of a memory cell array, pairs of bit lines coupled to the sense amplifiers in such manner that even bit line is coupled to even sense amplifier and odd bit line is coupled to odd sense amplifier, and switching transistors through which the sense amplifiers are connected to a pair of sub bit lines.

According to the present invention as described herein, the following benefits, among others, are obtained.

(1) Since pitch of sense amplifiers can be made more than four (4) times as compared with memory cell pitch, further higher integration of memory cells is possible.

(2) A pair of bit lines, which are directly connected to memory cells, are coupled to sub bit lines through sense amplifiers, read-out transistors. Therefore, information of memory cells which are connected to one (1) word line can be transferred to sub bit line simultaneously. This is important in parallel handling of ultra excess bit data.

(3) It is simply necessary that only one column decoder is coupled to end of bit line. Therefore, increase of size in a memory chip can be minimized.

(4) It is freely possible to divide a bit line regardless of column decoder, wiring area. Therefore, high speed operation of a memory chip can be realized.

While the novel features of the invention are set forth with particularly in the appended claims, the invention, both as to organization and content, will be better understood and appreciated, along with other objects and features thereof, from the following detailed description taken in conjunction with the drawing.

BRIEF DESCRIPTION OF THE DRAWINGS

FIG. 1 is a schematic block diagram of a semiconductor memory device which inventors studied prior to this invention;

FIG. 2 is a circuit diagram of a memory cell which is used in the semiconductor memory device of FIG. 1;

FIG. 7A shows conventional way and FIG. 7B shows the way according to this invention;

DETAILED DESCRIPTION OF THE INVENTION

Figure 3:
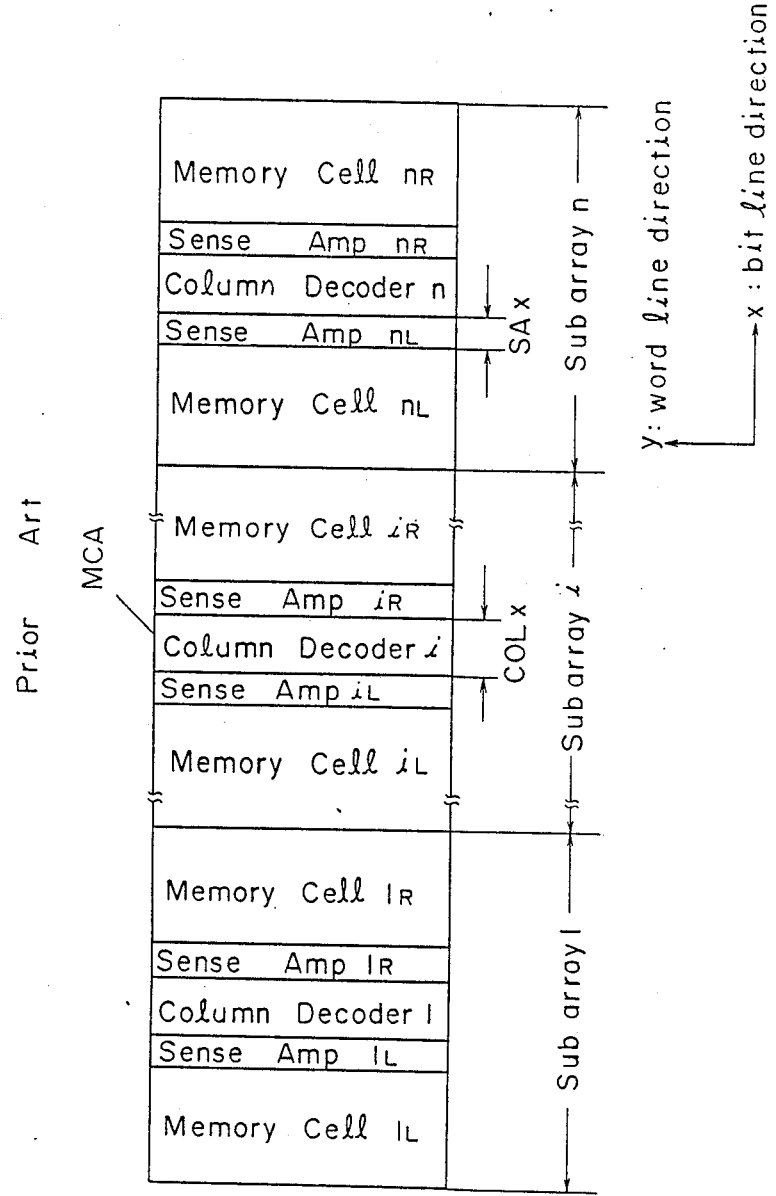
FIG. 3 is an illustration showing devision of an array of the semiconductor memory device of FIG. 1.

Before the invention itself is explained, a semiconductor memory device, in particular, DRAM which inventors studies prior to the invention is first explained to facilitate the understanding of the invention.

FIG. 1 shows memory cell array structure of such DRAM in both electrical and topographical manners. Memory cell array MCA includes plural pairs of bit lines BL1; $\overline{BL1}$; BL2, $\overline{BL2}$, BL3, $\overline{BL3}$; ...; BLi, $\overline{BLi}$ (i; integer) which are disposed in parallel number and a plurality of word lines WL1, WL2 ... WLj (j; integer) which are disposed in parallel manner and also in such manner that they intersect with bit lines perpendicularly. At intersecting points, memory cells MC1, MC2, ..., MCi are disposed. Memory cell are shown by circle mark in FIG. 1. C bit shows a stray capacitance between each bit line and ground. Sense amplifiers SA1, SA2, ... SAi are disposed at one end of memory cell array MCA and each pair of bit lines are connected to each sense amplifier. For example, a pair of bit lines BL1, $\overline{BL1}$ are connected to sense amplifier SA1. Further, sense amplifiers SA1∼SAi are connected to complementary data busses D, $\overline{D}$ through pair of data access transistors 31, 41; 32, 42; ... ; 3i, 4i. Therefore, bit lines are coupled to a pair of data buses through sense amplifiers and data access field effect transistors. The pairs of data access transistors are controlled by decoder unit DU. More specifically, gate electrodes of first pairs of transistors 31, 41 are coupled to bit line decoder unit BD through conductor 11. In the same manner, gate electrodes of i-th pairs of transistors 3i, 4i are coupled to bit line decoder unit BD through conductor li. The structure of each memory cell is the same and shown in FIG. 2. Memory cell is formed by switching field effect transistor 20 and memory cell capacitor 21. Bit line BLi is coupled to electric potential V plate through transistor 20 and capacitor 21. The gate of transistor 20 is coupled to word line WL;

For example, when information is read out from memory cell MC1, following operations are carried out. First, word line WL1 is selected by word line decoder unit WD and transistor 20 in memory cell MC1 is rendered conductive. Thereby, signal charge in capacitor 21 of memory cell MC1 is read out to bit line $\overline{BL1}$ so that minute difference of electric potential occurs between a pair of bit lines BL1 and $\overline{BL1}$. Such difference is amplified by sense amplifier SA1 and thereafter, transferred to data buses D, $\overline{D}$ through transistors 31, 41 which are rendered conductive by the control of bit line decoder unit BD.

DRAM of such structure has following drawbacks.

(1) As higher integration of memory cells progresses, pitch SAy (see, FIG. 1) of sense amplifier in y direction decreases. Thereby, it becomes difficult to form stable and well operable sense amplifier within the pitch SAy.

(2) As memory capacitance which is required for a semiconductor memory device increases, the number of memory cells which are connected to one bit line increases. Thereby, bit line capacitance increases so that operational clearance of entire memory device decreases. Because, in case that signal charge is read out from a memory cell to a bit line, as ratio of bit line capacitance (C bit) and memory cell capacitance (Cs); C bit/Cs increases, difference of electric potential between bit lines decreases.

To decrease C bit/Cs, bit lines can be deviced into plural areas as shown in FIG. 3. In FIG. 3, memory cell array MCA is divided into plural sub arrays 1, 2, ... i, ... n in the direction of bit lines. In each sub array, bit line decoder unit or column decoder unit is provided so that decoding operation of each sub array is carried out independently. In such structure, however, it is necessary to provide a column decoder unit for each sub array so that chip size increases.

That point is further explained as follows.

Figure 5:
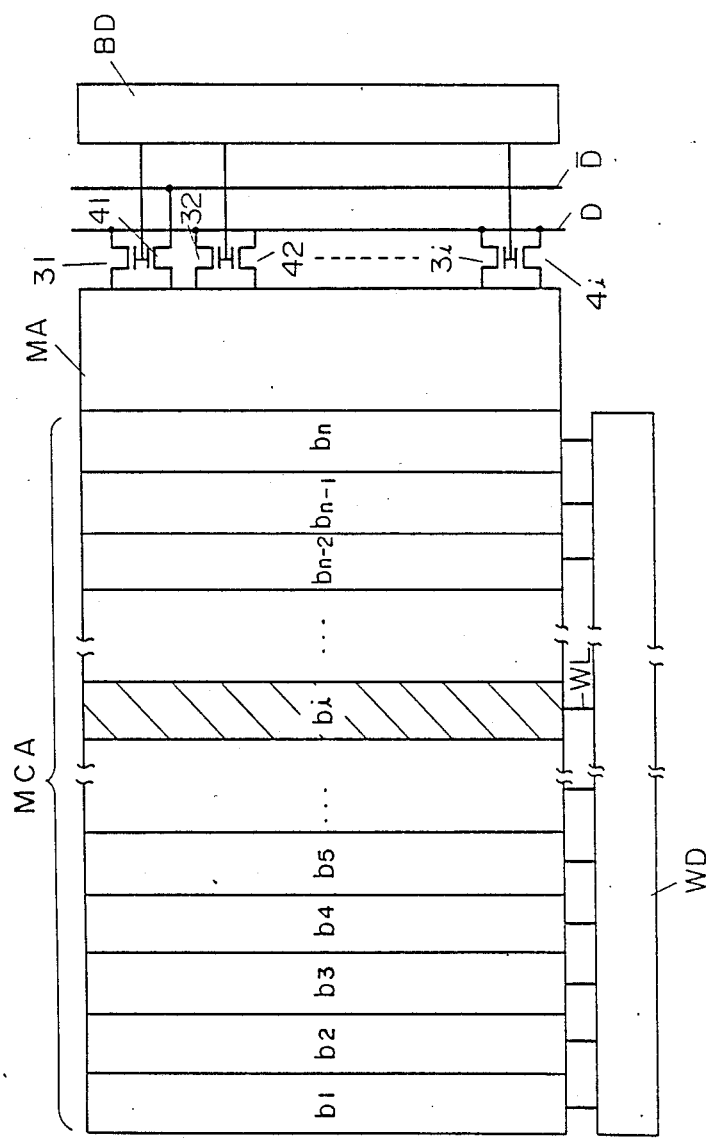
FIG. 5 is an illustration showing layout of a semiconductor memory device of a first embodiment according to the invention.

In FIG. 5, it is supposed that a direction parallel to bit lines is defined as x direction, and a direction parallel to word lines is defined as y direction, and magnitude of column decoder in the x direction is COLx, and magnitude of sense amplifier in the x direction is SAx, and the number of sub arrays divided from memory cell array is N.

The increase $\Delta x$ of chip size in the x direct ion as compared with that of N=1 is shown by following equation.

$$\Delta x = (COLx + 2SAx) \cdot (N-1) \quad (1)$$

In case that a column decoder unit is disposed at the middle of each sub array, the number of bit lines divided $M_B$ and the number of sub arrays divided N have following relations.

$$N = \tfrac{1}{2} \cdot M_B \quad (2)$$

Therefore, $\Delta x$ is shown by following equation.

$$\Delta x = (COLx + 2SAx) \cdot (\tfrac{1}{2} M_B - 1) \ldots \quad (3)$$

As apparent from this equation, $\tfrac{1}{2} \cdot COL_x \cdot M_B$ is one of factors in $\Delta x$. Therefore, if bit lines are divided into plural areas, chip size increases considerably.

Figure 4:
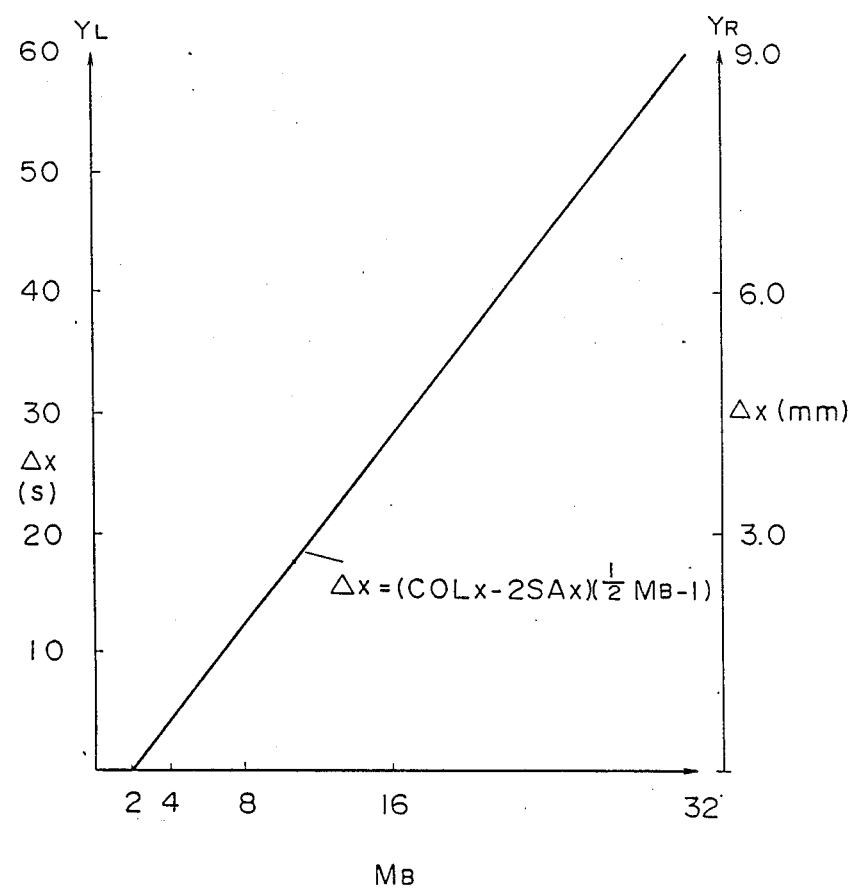
FIG. 4 is a graph showing relation of increase of chip size and division number.

FIG. 4 shows the relation of $\Delta x$ and $M_B$. In FIG. 4, following assumption is used.

$$COL \cong 2S \quad (4)$$

$$SAx \cong S \quad (5)$$

In particular, as one specific example, a memory device corresponding to 4 M bit DRAM is used and its $\Delta x$ is calculated with $S \cong 150 \ \mu m$ (see $Y_R$).

As apparent from the foregoing, when $M_B$ is 16 or more, $\Delta x$ becomes 3 mm or more which is a extremely important problem.

Under such technical background, this invention is made to solve the above-stated problem. FIG. 5 shows a semiconductor memory device, in particular, DRAM of a first embodiment of the invention. Same numerals as in FIGS. 1 and 2 are used in FIG. 5 as showing same components.

In FIG. 5 structure, peripheral circuitry is substantially the same as that of FIG. 1 as apparent from the comparison of FIG. 5 structure and FIG. 1 structure. That is, one bit line decoder unit or column decoder unit BD is disposed at right hand side of memory cell array MCA and one word line decoder unit or row decoder unit WD is disposed at lower side of memory cell array MCA. The column decoder unit BD controls pairs of data access transistors 31, 41; 32, 42; . . . ; 3i, 4i through conductors 11, 12, . . . 11i. These transistors are inserted between a pair of complementary data busses D, $\overline{D}$ and middle amplifier unit MA. The middle amplifier unit MA will be explained later with reference to FIG. 6. The memory cell array MCA is divided into a plurality of blocks b1, b2, . . . , bi, . . . bn (i, n; integer). These blocks will be explained later with reference to FIG. 6.

Figure 6:
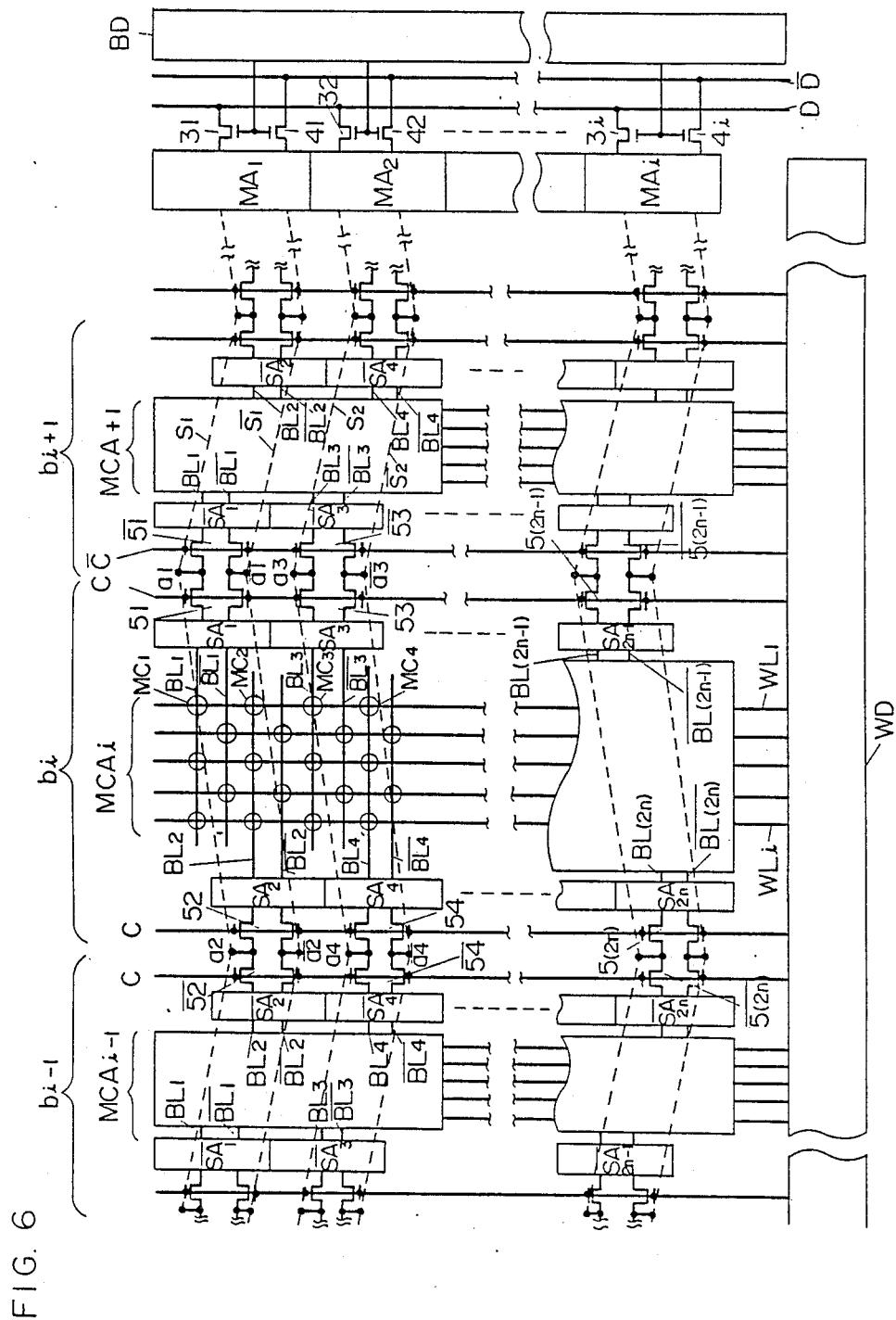
FIG. 6 is a schematic block diagram of the semiconductor memory device of FIG. 5.

FIG. 6 shows schematic circuit diagram of FIG. 5 DRAM. Each block has substantially the same structure. Therefore, block bi is explained as representative.. There provided a divided memory cell array MCAi. At the right-hand-side of divided memory cell array MCAi, odd sense amplifiers SA1, SA3, . . . SA(2n−1) are disposed. At the left-hand-side of the array MCAi, even sense amplifiers SA2, SA4, . . . SA(2n) are disposed. Pairs of odd bit lines, i.e., BL1, $\overline{BL1}$; BL3, $\overline{BL3}$ . . . ; BL(2n−1), $\overline{BL(2n-1)}$ are connected to odd sense amplifiers SA1, SA3, . . . SA(2n−1), respectively as shown in FIG. 6. Pairs of even bit lines, i.e., BL2, $\overline{BL2}$; BL4, $\overline{BL4}$; . . . ; BL(2n), $\overline{BL(2n)}$ are connected to even sense complifiers SA2, SA4, . . . , SA(2n).

At the right-hand-side of MCAi, there provided another divided memory cell array MCAi+1. The structure of MCAi+1 is complementary to that of MCAi. That is, complementary sense amplifiers $\overline{SA1}$, . . . , $\overline{SA(2n)}$ are disposed in substantially the same manner as those in MCAi. Adjacent sense amplifiers, e.g., SA1 and $\overline{SA1}$, SA3 and $\overline{SA3}$, . . . SA(2n−1) and $\overline{SA(2n-1)}$ are coupled through read-out MOS FET portions 51, $\overline{51}$; 53, $\overline{53}$; . . . 5(2n−1), $\overline{5(2n-1)}$, respectively.

At the left-hand side of MACi, there provided still another divided memory cell array MACi−1. The structure of MCAi−1 is complementary to that of MACi, and the same as that of MCAi+1. That is, complementary sense amplifiers $\overline{SA1}$, . . . , $\overline{SA(2n)}$ are disposed in the same manner as those in MCA. Adjacent sense amplifiers, e.g., SA2 and $\overline{SA2}$, SA4 and $\overline{SA4}$, . . . , SA(2n) and $\overline{SA(2n)}$ are coupled through read out MOS FET portions 52, $\overline{52}$; 54, $\overline{54}$; . . . ; 5(2n), $\overline{5(2n)}$, respectively.

As apparent from the foregoing, at the right-hand side of MCAi+1, there provided array MCAi+2 whose structure is complementary to that of MCAi+1 and the same as that of MCAi. Also, at the left-hand side of MCAi−1, there provided array MCAi−2 whose structure is complementary to that of MCAi−1 and the same as that of MCAi. Divided memory cell arrays MCA1~MCAn are disposed in such manner stated above. Connecting portions of read-out MOS FET portions, e.g., a1 and $\overline{a1}$, a2 and $\overline{a2}$, a3 and $\overline{a3}$, . . . a(2n) and $\overline{a(2n)}$ are connected to sub bit lines S1, $\overline{S1}$; S2, $\overline{S2}$; . . . ; S(2n), $\overline{S(2n)}$ in such manner that a1 and a2 are connected to S1, $\overline{a1}$ and $\overline{a2}$ are connected to $\overline{S1}$, a3 and a4 are connected to S2, $\overline{a3}$ and $\overline{a4}$ are connected to $\overline{S2}$, . . . These sub bit lines S1, $\overline{S1}$, S2, $\overline{S2}$ . . . are coupled to data busses, D, $\overline{D}$ through middle amplifiers MA1, MA2, . . . are data access transistors.

The operation of the semiconductor memory device shown in FIGS. 5 and 6 is now explained.

When information stored in memory cell MC1 is readout, word line WL1 is first selected by row decoder unit WD and then, transistor 20 in memory cell MC1 (see, FIG. 2) is rendered conductive. As a result, signal charge in capacitor 21 (see, FIG. 2) is readout to bit line BL1 and thereby, there occurs minute difference of electric potential between bit lines BL1 and $\overline{BL1}$. The minute difference is, then, amplified by sense amplifier SA1. The signal voltage amplified by sense amplifier SA1 is applied to a pair of sub bit lines S1 and $\overline{S1}$ through readout transistors 51 and connecting portions a1, $\overline{a1}$. Thereafter, the signal voltage is further amplified by middle amplifier MA1, and then, readout to complementary data busses D, $\overline{D}$ through MOS transistors 31, 41 which are rendered conductive by column decoder unit BD.

When information stored in memory cell MC2 is readout, word line WL1 is selected and signal charge is readout to bit line BL2. Minute difference of electric potential between bit lines BL2 and $\overline{BL2}$ is amplified by sense amplifier SA2. The signal voltage amplified by sense amplifier SA2 is applied to middle amplifier MA1 through readout transistors 52, connecting portions a2, $\overline{a2}$, and sub-bit lines S1, $\overline{S1}$.

As apparent from FIG. 6, in particular block bi, each block includes a memory cell array and, sense amplifiers and readout transistors disposed at both sides of the memory cell array.

Returning to FIG. 5 structure, for example, when information of a memory cell in block bi, corresponding word line WL is selected and signal charge is readout to bit lines in block bi. Then, a specific sense amplifier which is connected to the bit lines operates to amplify signal voltage. At this time, sense amplifiers in other blocks do not operate. Thereby, instantaneous current upon readout operation decreases. The signal voltage amplified by the sense amplifier in the block is readout to sub bit lines through readout transistors and then, to a middle amplifier. After the signal voltage is amplified by the middle amplifier, the signal voltage is outputted to data busses D, $\overline{O}$.

As apparent from the foregoing, following advantages may be obtained according to this invention.

(1) It is possible to loose the pitch of sense amplifiers. Since sense amplifiers are divided into two groups and such two group amplifiers are disposed at both sides of a memory cell array, pitch of sense amplifiers can be made larger than that of bit lines. Therefore, sense amplifiers of high sensitivity with electrical symmetry can be realized.

(2) It is not necessary to provide column decoders for each block. That is, only one column decoder is necessary for all blocks as shown in FIGS. 5 and 6. This means that even if the number of dividsion of memory cell array increases, chip size does not increase.

(3) High speed operation of an entire memory device can be realized. This point is clarified as follows. First, why high speed operation can not be realized in FIG. 1 structure is explained. In FIG. 1, a plurality of MOS transistors 31, 41, 32, 42 . . . 3i, 4i are connected to data busses D, $\overline{D}$. Therefore, stray capacitance of data busses D, $\overline{D}$ is enlarged. Under this circumstance, readout operation is carried out as follows. That is, data readout from a memory cell MC is amplified by a sense amplifier SA. The amplified data is readout to data busses D, $\overline{D}$ through one of MOS transistors 31, 32 . . . . Actually, electric charge on data busses D, $\overline{D}$ is pull out to power supply line or ground line through one of MOS transistors 31, 32 . . . and sense amplifier SA.

In such structure, it is necessary to provide MOS transistors 31, 32 . . . for pulling out electric charge on data busses D, $\overline{D}$. Therefore, it is difficult to enlarge the size of MOS transistors 31, 32 . . . due to limitation of chip size, so that ON resistance of MOS transistors 31, 32 . . . becomes high.

Further, in FIG. 1 structure, refresh operation of memory cell from which data has been readout, and pull out operation of electric charge on data busses are carried out simultaneously by a sense amplifier. Thereby driving ability of a sense amplifier which is alloted for pull out operation decreases.

In sum, in FIG. 1 structure, electric charge on data busses D, $\overline{D}$ having large stray capacitance is driven by MOS transistor 31, 32 . . . and sense amplifier with low driving ability. This becomes an obstacle for speed up operation.

In contrast, a semiconductor memory device of FIGS. 5 and 6 is explained. In FIG. 6, it is not necessary to provide MOS transistors 31, 41, 32, 42 . . . and data busses D, $\overline{D}$ for each block. That is, single unit of MOS transistors and data busses is used for all blocks. Therefore, it is possible to enlarge the size of transistors 31, 41 . . . and the size of transistors (not shows) of middle amplifiers without affecting chip size.

Further, if plural pairs of data busses D, $\overline{D}$ are provided, the number of readout transistors 31, 41 . . . which are connected to one pair of data busses D, $\overline{D}$ decreases so that stray capacitance on data busses decreases. Therefore, it becomes possible to provide plural pairs of data busses without aggravating chip size efficiency.

In FIG. 6 structure, refresh operation of memory cells is carried out by sense amplifiers in each block, and pull-out operation of electric charge on data busses is carried out by middle amplifiers which are connected to one end of sub bit lines. Therefore, driving ability for the pull out operation can be made larger than that in FIG. 1 structure. In sume, in FIG. 6 structure, electric charge on data busses D, $\overline{D}$ having small stray capacitance is driven by MOS transistors and sense amplifier with high driving ability so that high speed operation can be realized.

Also, in FIG. 6 structure, it is necessary to transfer data from a sense amplifier SAi to sub bit lines Si, $\overline{Si}$. Since the number of readout transistors 51, 53 . . . which are connected to sub bit lines is small and a uppest layer can be used as sub bit lines, it is possible to decrease stray capacitance on sub bit lines. Therefore, it is possible to transfer at high speed data from sense amplifier Si to sub bit lines Si, $\overline{Si}$.

(4) It is possible to handle super large bit data according to the invention. Super large bit means 512 bit, 1024 bit or more in this case.

Figure 7A:
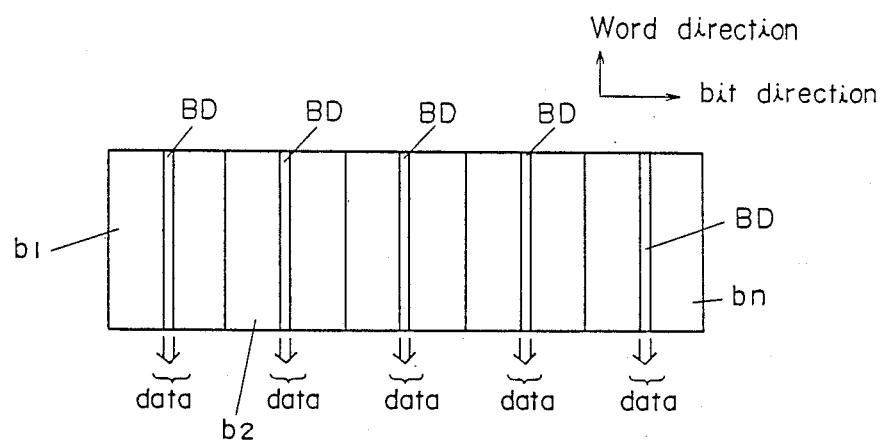
FIGS. 7A and 7B are illustrations showing a way of producing multi-bit data.

Why handling of such super large bit is impossible in conventional structure is explained with reference to FIGS. 7A and 7B. FIG. 7A shows conventional memory structure in which memory cell array MCA is divided into a plurality of blocks b1~bn, and column decoder BD is disposed in each block. In this case, data are outputted in only lower direction of FIG. 7A. Therefore, the number of data which can be outputted in parallel manner simultaneously is at most several times more than the number of blocks, so that 32 bit or 64 bit is the highest bit for handling.

Figure 7B:
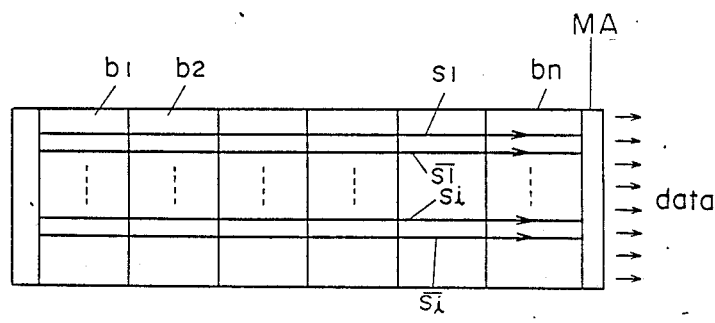

In contrast, FIG. 7B shows a memory structure of the invention in which sub bit lines are disposed over all blocks and middle amplifiers MA are connected to one end of sub bit lines. Therefore, it is readily possible to output large member data, e.g., 512 bit, 1024 bit or more. Such handling of super large bit data becomes importance as DRAM is mounted on various kinds of LS1.

Figure 8:
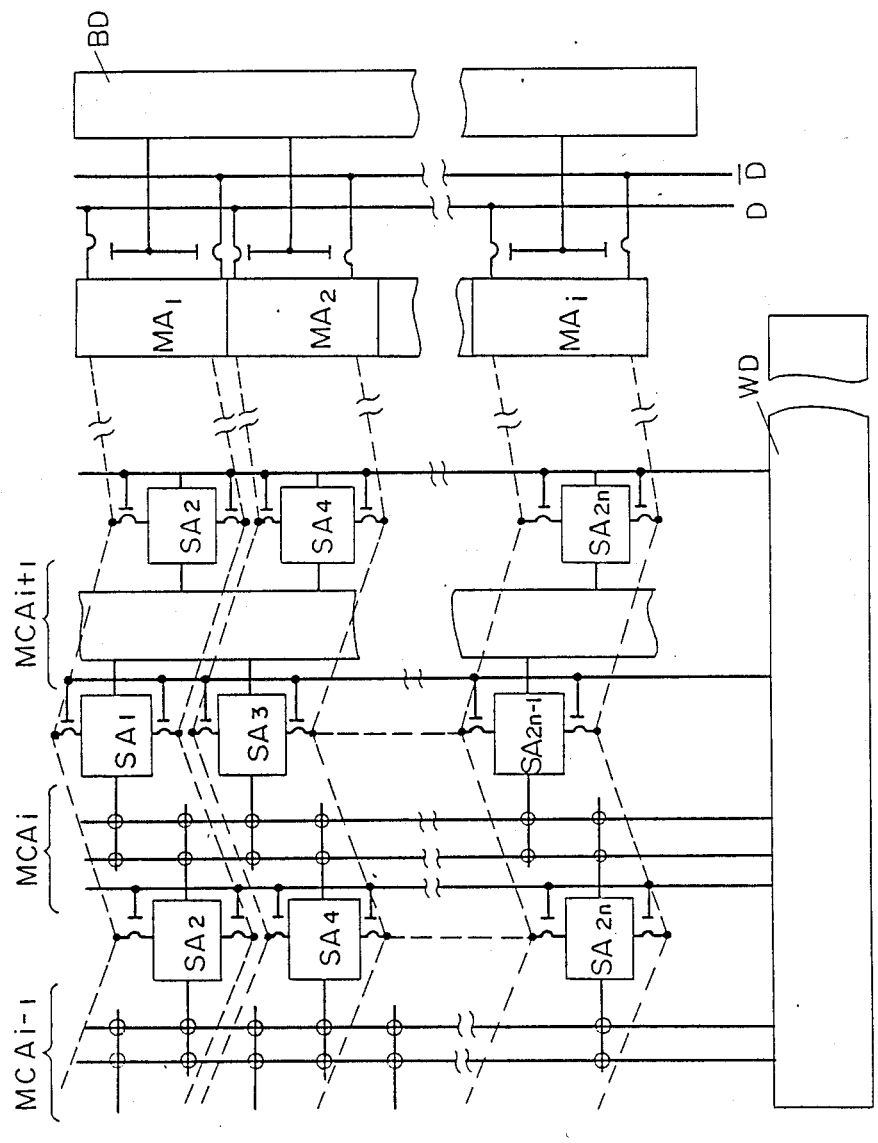
FIGS. 8 and 9 are schematic block diagrams of semiconductor memory devices of second and third embodiment according to the invention.

FIG. 8 shows a second embodiment of the invention. Same numerals as in FIG. 6 are used to show the same components. As apparent from the comparison of FIGS. 6 and 8, FIG. 6 shows a folded-bit-line type DRAM and FIG. 8 shows an open-bit-line type DRAM. That is, this invention is applicable to both a folded-bit-line type and open-bit-line type DRAMs.

Figure 9:
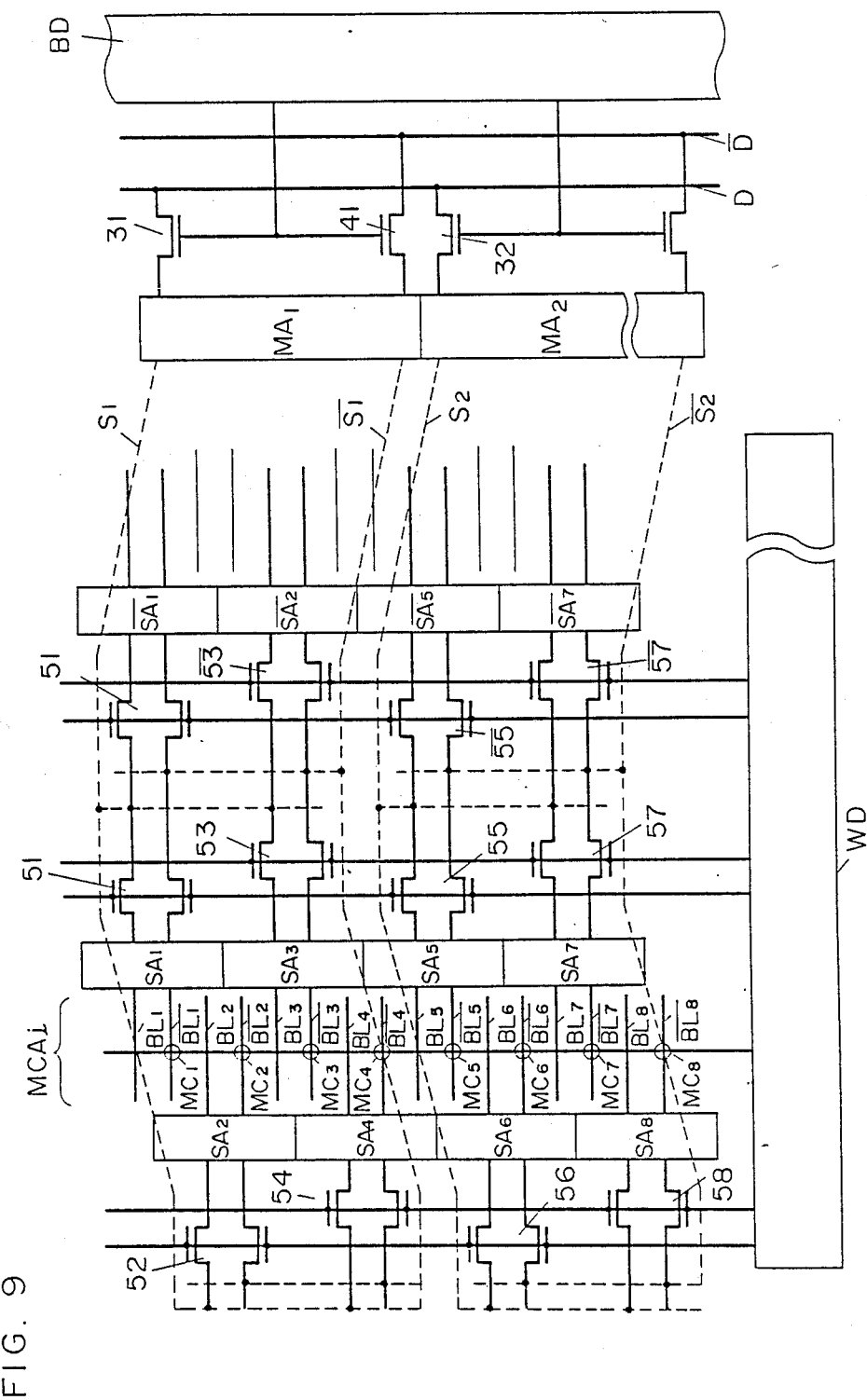

FIG. 9 shows a third embodiment of the invention. Same numerals as in FIG. 6 are used to show the same component. The difference between FIG. 6 structure and FIG. 9 structure is as follows. In FIG. 6, a pair of sub bit lines are provided per two pairs of bit lines, but in FIG. 9, a pair of sub bit lines are provided per four pairs of bit lines. By enlarging the pitch of sub bit lines in the above-stated manner, it becomes possible to connect more complicated/ sophisticated circuits to the end of sub bit lines.

Figure 10:
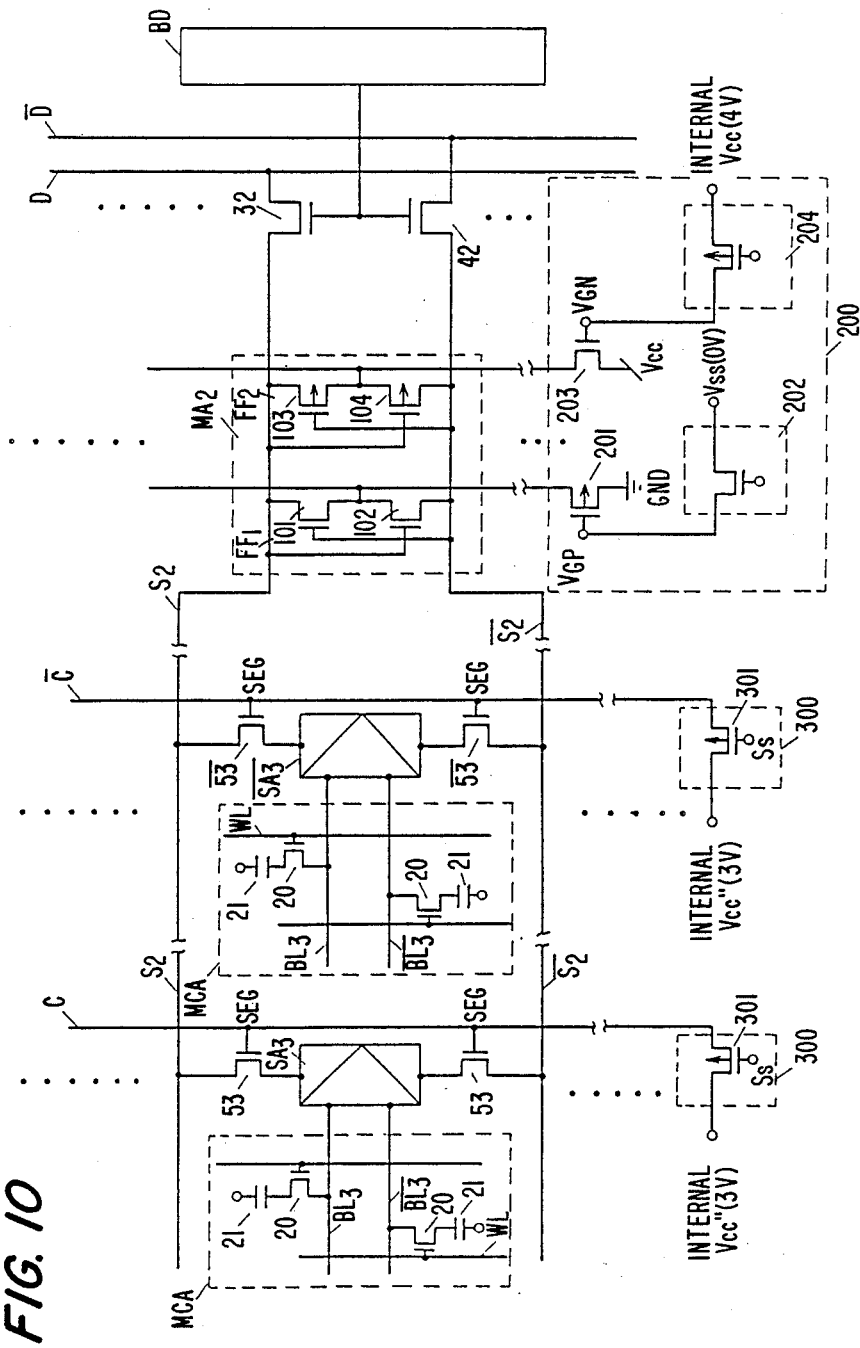
FIG. 10 is a schematic block diagram of a semiconductor memory device of fourth embodiment according to the invention.

FIG. 10 shows an application example which is formed based upon FIG. 6 structure. It is of course possible to form the example based upon FIG. 8 or FIG. 9 structure. Same numerals as in FIG. 6 are used to show the same components. The example shown in FIG. 10 is of low power consumption type. Low power consumption is carried out by controlling amplitude of voltage which appears on a pair of sub bit lines Si, $\overline{Si}$ so that instantaneous peak current is restricted. Such a FIG. 10 structure has the following features.

(1) When a pair of sub bit lines are driven by a signal from a sense amplifier which is coupled to a pair of bit lines, amplitude of voltage of transfer signal is restricted by a first voltage control circuit.

(2) A second voltage control circuit is provided with a middle amplifier which is connected to a pair of sub bit lines, and amplitude of voltage of a signal which appears on a pair of sub bit lines is restricted by the second voltage control circuit.

FIG. 10 structure is applicable to entire circuit shown in FIG. 6, but, by the reason that explanation is simplified, FIG. 10 shows a part of entire circuit as a representative. The middle amplifier MA2 is composed of a first flip-flop (FF) circuit FF1 which is formed by N-type MOS FET 100, 101 and a second flip-flop (FF) circuit FF2 which is formed by P type MOS FET 102, 103. The middle amplifier MA2 is coupled to second voltage control circuit 200. The second voltage control circuit 200 is composed of P-type MOS FET 201 which is coupled to first FF circuit FF1, control circuit 202 by which a signal $V_{GP}$ is controlled, N-type MOS FET 203, and control circuit 204 by which $V_{GN}$ is controlled. By used of such a structure, high level of a pair of sub bit lines S2, $\overline{S2}$ becomes ($V_{GN} - V_{tN}$), and low level thereof becomes ($V_{tp}$), wherein $V_{GN}$ is a voltage applied to a gate of MOS FET 203 as shown in FIG. 10; $V_{tN}$ is a threshold voltage of MOS FET 203; and $V_{tp}$ is a threshold voltage of MOS FET 201. Therefore, if it the values of $V_{GN}$, $V_{tN}$, $V_{tp}$ are set properly and arbitrarily, amplitude of arbitrary value can be obtained. The gates of FETs 203, 201 (in other words, $V_{GN}$, $V_{GP}$) are applied with arbitrary internal reference voltage, i.e., INTERNAL Vcc (e.g., 4 V), Vss (e.g., 0 V) which are generated by internal down converter (see, FIG. 18).

First voltage control circuit 300 are coupled to control lines C, $\overline{C}$ as shown in FIG. 10. The first voltage control circuit 300 is used for controlling a signal SEG which is inputted to FETs 53 to control current flowing through FETs 53. The first voltage control circuit 300 is composed on one P-type MOS FET 301. The source of FET 301 is applied with internal reference voltage INTERNAL Vcc" (e.g., 3 V) which is generated by the down converter (see, FIG. 18), and the gate of FET 301 is coupled with a select signal by which a pair of bit lines is selected among many pairs of bit lines BL1, $\overline{BL1}$ ....

Figure 11:
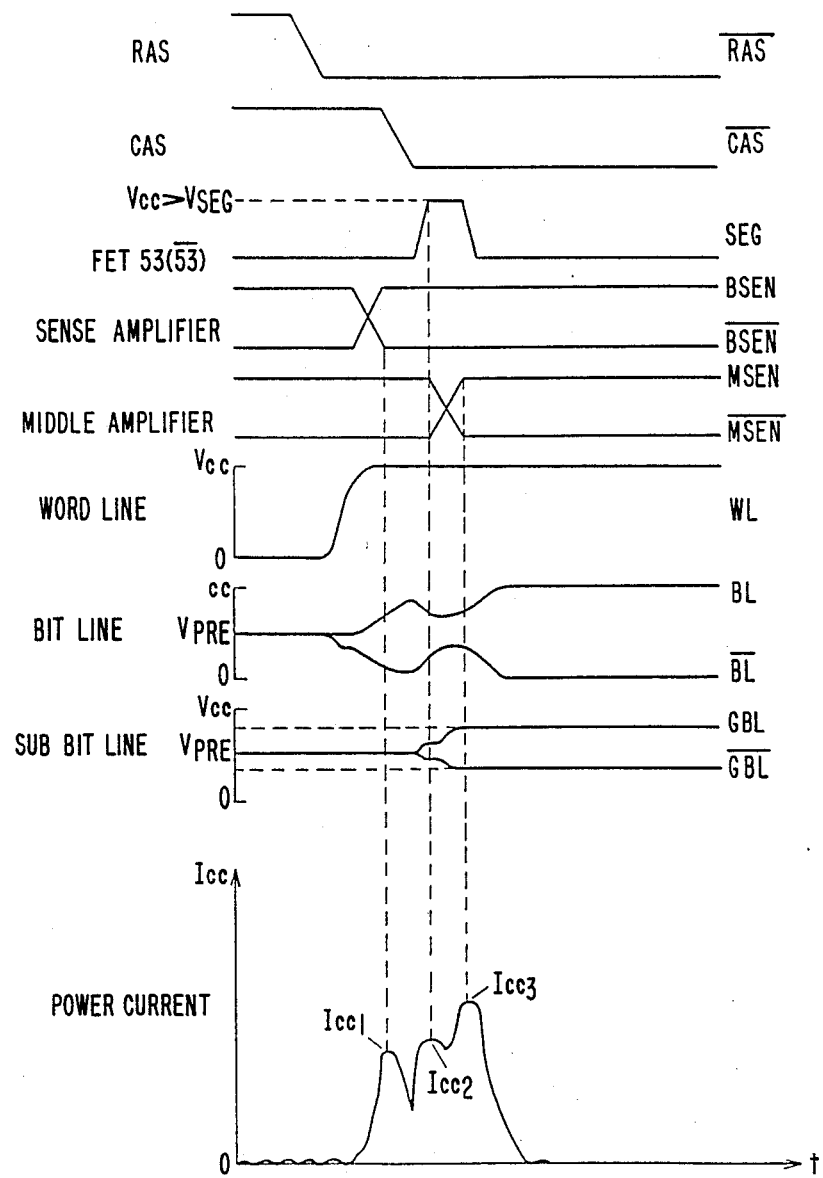
FIGS. 11 and 12 show wave forms for explaining the operation of the fourth embodiment.

The operation of FIG. 10 structure is explained with reference to FIG. 11. When a information stored in a memory cell is readout, a pulsive select signal Ss is applied to first voltage control circuit 300 which corresponds to said memory cell selected, and thereby, signal SEG is applied to FETs 53. An amplitude $V_{SEG}$ of pulse voltage of signal SEG has been previously set to be Vcc" (3 V) which is smaller than INTERNAL Vcc (4 V). As a result of such a setting, a capacitance of a pair of sub bit lines S2, $\overline{S2}$ which is looked at from a side of sense amplifier SA3 (or $\overline{SA3}$) becomes smaller, and thereby, initial instantaneous peak current ICC2 can be restricted.

Further, when signals MSEN, $\overline{MSEN}$ (see, FIG. 11) which are used for activating middle amplifier MA2 are inputted, maximum amplitude of a signal appearing on a pair of sub bit lines S2, $\overline{S2}$ is restricted in a range of $V_{tp} - (V_{GN} - V_{tN})$ by the operation of second voltage control circuit 200, and thereby, charging 1 discharging current is restricted so that maximum peak current ICC3 is restricted.

Figure 12:
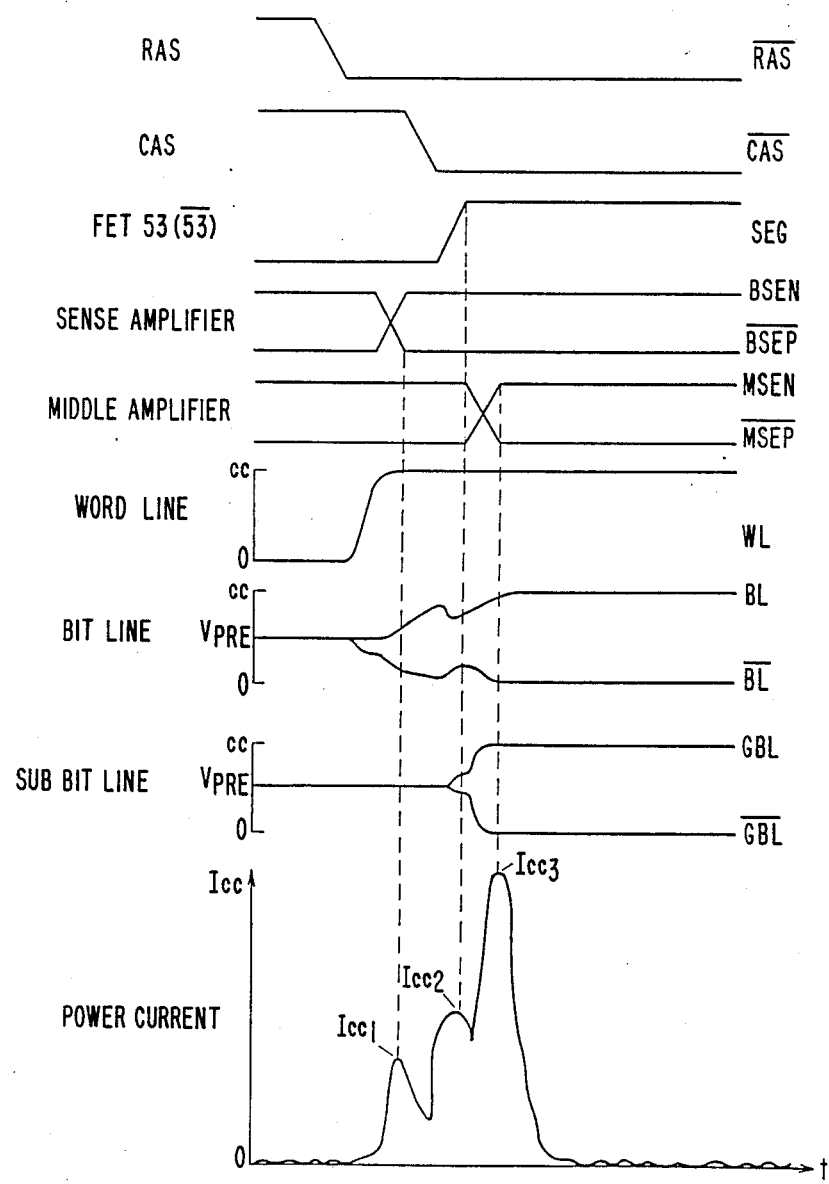

Incidentally, FIG. 12 shows waveforms of a circuit structure without use of first and second voltage control circuits 200, 300. Advantages of the control circuits 200, 300 are obvious by comparing FIG. 11 with FIG. 12.

Figure 13:
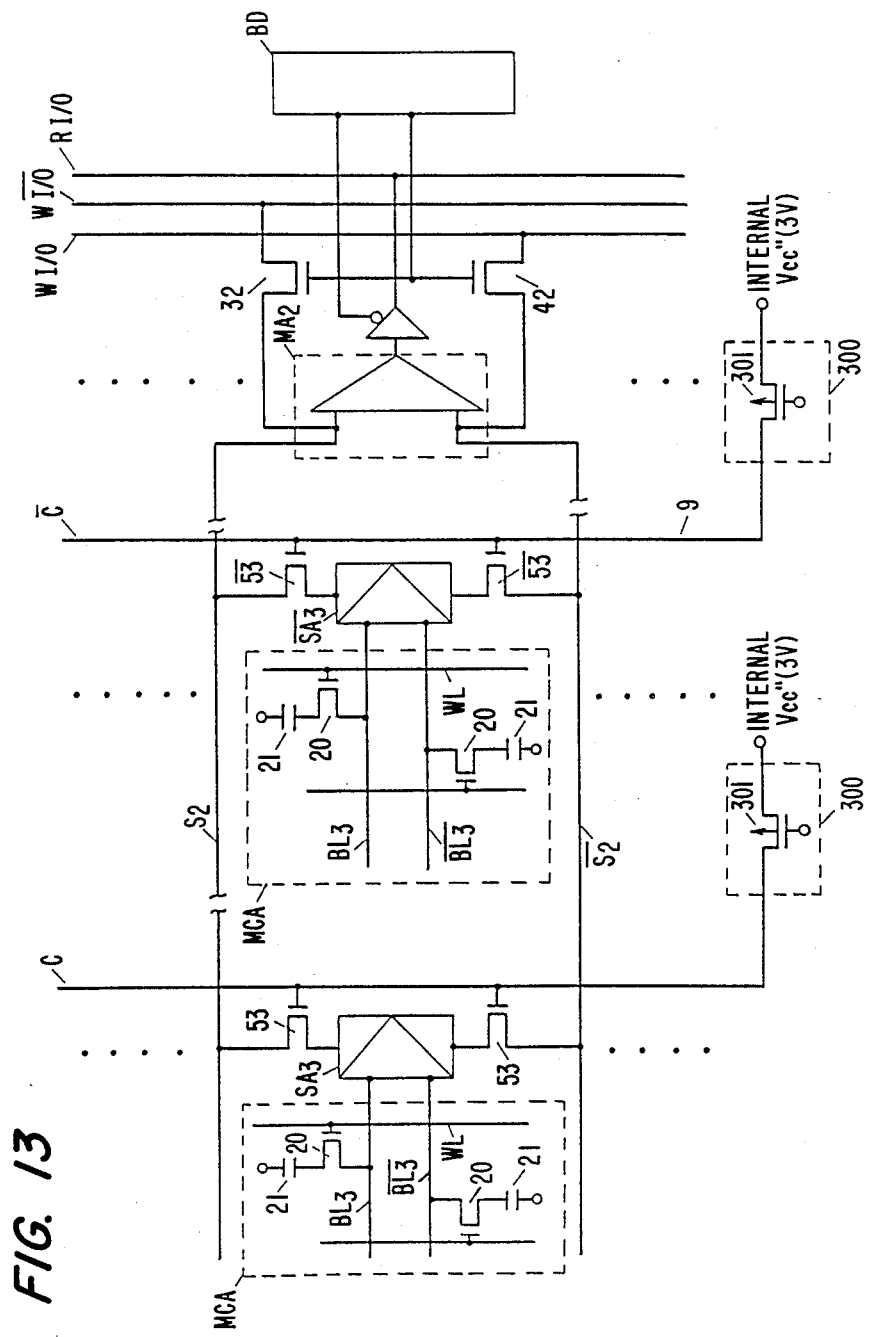
FIG. 13 is a schematic block diagram of a semiconductor memory device of fifth embodiment according to the invention.

FIG. 13 shows a modification of FIG. 10 structure. In FIG. 13, middle amplifiers are composed of current-mirror-type differential amplifiers (FIG. 13 shows one middle amplifier MA2 to simplify the explanation). This kind of middle amplifier does not latch a pair of sub bit lines by use of flip-flop circuit (see, FIG. 10). Therefore, upon reading out information from a memory cell, amplitude of sub bit lines can be controlled only from sense amplifier side through FETs 53, $\overline{53}$ and it is not necessary to dispose second voltage control circuit 200 for middle amplifier (see, FIG. 10).

When information is written into a memory cell, a data is inputted into current-mirror-type differential amplifier through FETs 32, 42 from writing I/O (W I/O, W $\overline{I/O}$).

Figure 14:
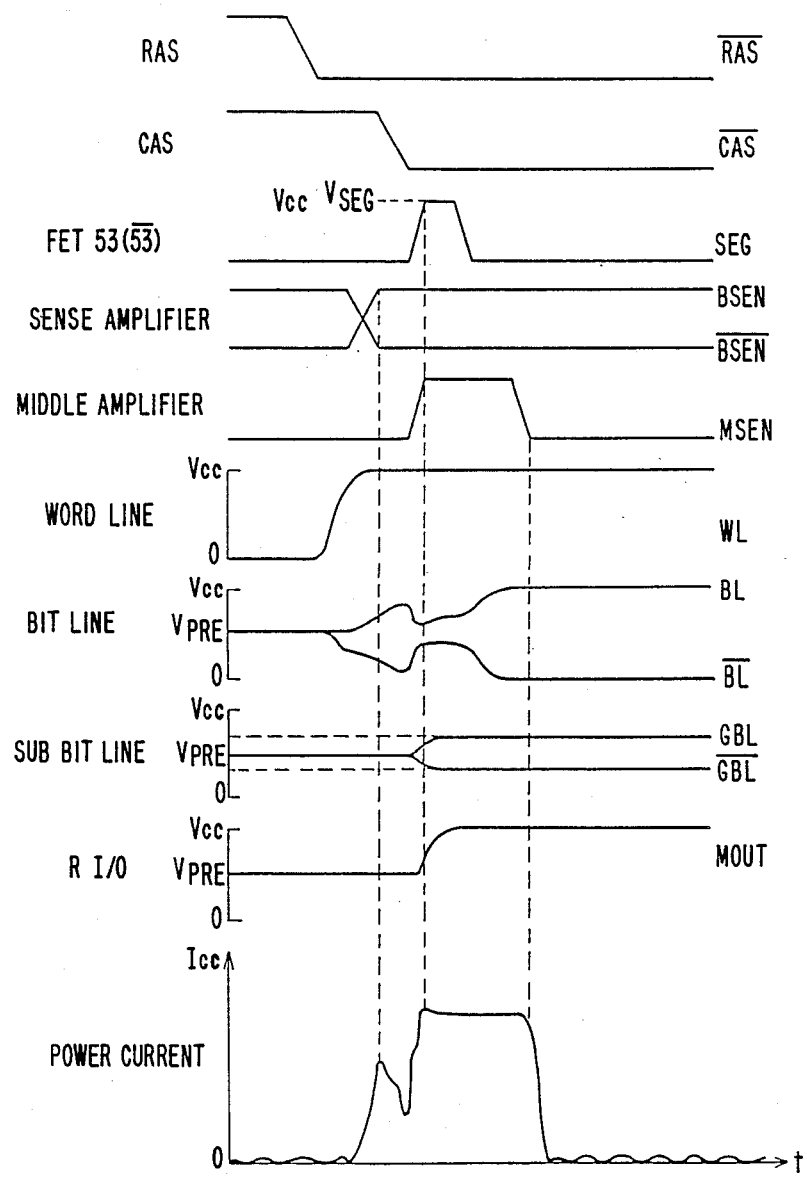
FIG. 14 shows wave forms for explaining the operation of the fifth embodiment.

The operation of FIG. 13 structure is explained with reference to FIG. 14. The signal SEG is the same as explained in FIGS. 10, 11. As stated above, since a middle amplifier is composed of current-mirror-type differential amplifier, latch operation to a pair of sub bit lines does not occur so that peak current Icc3 does not occur.

Figure 15:
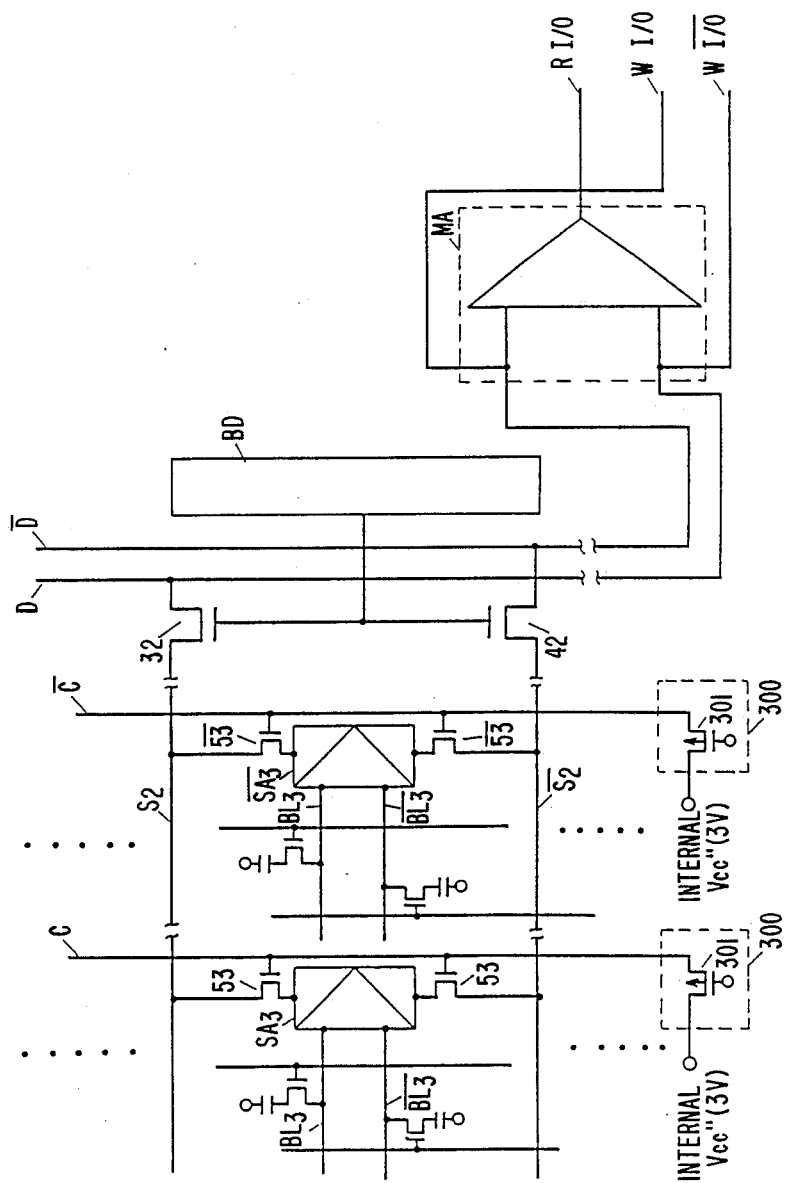
FIG. 15 is a schematic block diagram of a semiconductor memory device of sixth embodiment according to the invention.
Figure 16:
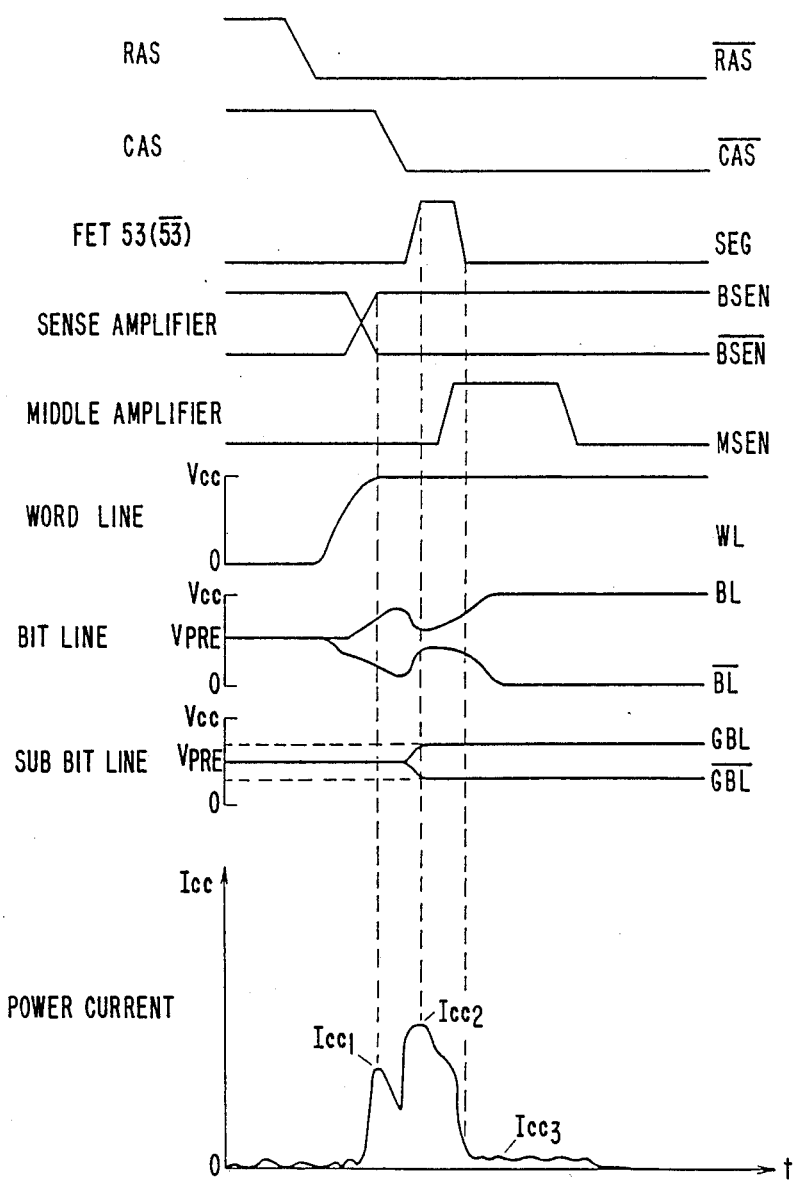
FIG. 16 shows wave forms for explaining the operation of the sixth embodiment.

Another two modifications are explained with reference to FIGS. 15-18. Feature of the modifications is that single middle amplifier MA is disposed in data busses or I/O lines. That is, it is not necessary to provide with many middle amplifiers. In FIG. 15, the single middle amplifier is composed of current-mirror-type differential amplifier whose power consumption is low. Since such an amplifier is of high sensitivity in wider pitch, it becomes possible to provide a circuit structure of high sensitivity and low power consumption. FIG. 16 shows waveforms of major points in FIG. 15 structure.

Figure 17:
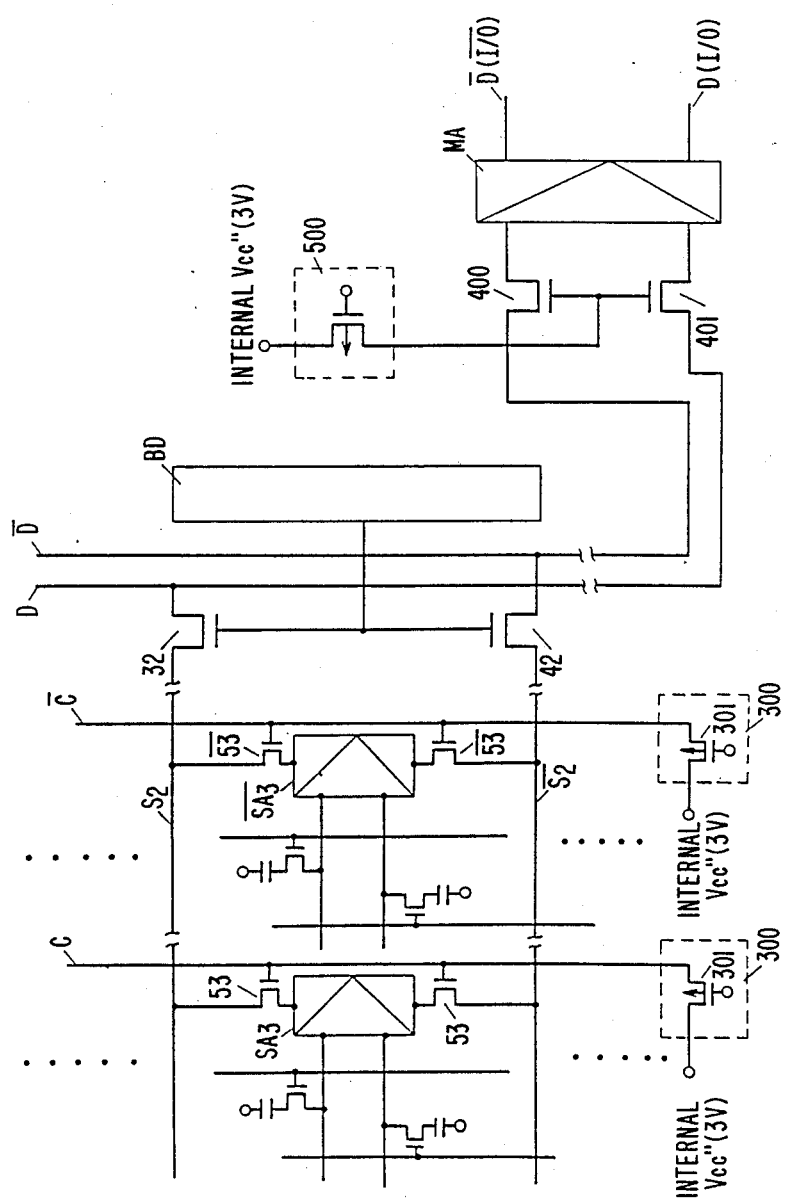
FIG. 17 is a schematic block diagram of a semiconductor memory device of seventh embodiment according to the invention.
Figure 18:
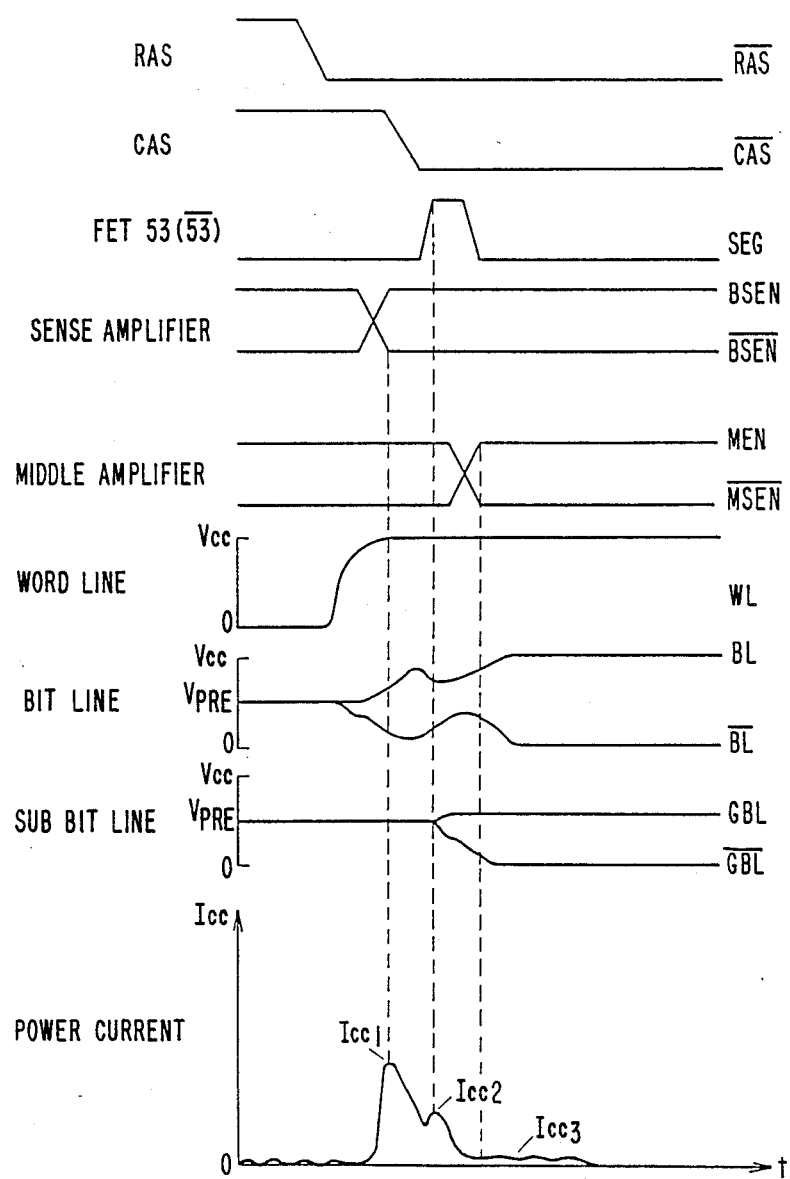
FIG. 18 shows waveforms for explaining the operation of the seventh embodiment.

In FIG. 17, FETs 400, 401 is disposed between a single middle amplifier MA and FETs 32, 42 ... and the gates of FETs 400, 401 are controlled by a third voltage control circuit 500. When a voltage appearing on a pair of sub bit lines reaches a voltage which can be amplified by middle amplifier MA precisely, FETs 400, 401 are rendered non-conductive by circuit 500 so that middle amplifier MA is separated from data busses D, $\overline{D}$ and unnecessary voltage amplitude on a pair of bit lines and data busses is restricted. FIG. 18 shows waveforms of major points in FIG. 17 structure.

Figure 19:
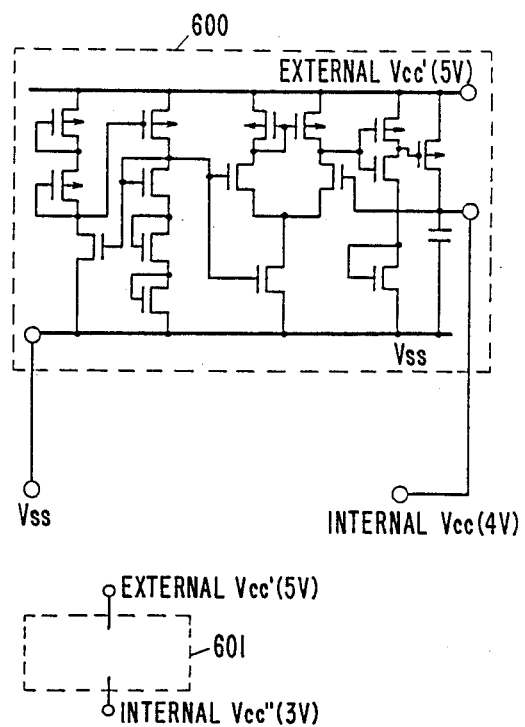
FIG. 19 is a circuit diagram of a part of the semiconductor memory device.

FIG. 19 shows an example of a down converter which can generate internal reference voltages. Down converter 600 produces INTERNAL Vcc (4 V) from EXTERNAL Vcc' (5 V) and down converter 601 produces INTERNAL Vcc" (3 V) from EXTERNAL Vcc' (5 V).

While specific embodiments of the invention have been illustrated and described herein, it is realized that other modification and changes will occur to those skilled in the art. It is therefore to be understood that the appended claims are intended to cover all modifications and changes as fall within the true spirit and scope of the invention.

What we claim is:

1. A semiconductor memory device comprising:
   a memory cell array having a plurality of bit lines disposed in a parallel manner, a plurality of word lines disposed in a parallel manner and intersected with said bit lines perpendicularly, a plurality of memory cells coupled between said bit and word lines for storing data therein;
   a plurality of sense amplifiers disposed at both sides of said memory cell array in such manner that odd numbered sense amplifiers are disposed at one side of said memory cell array and even numbered sense amplifiers are disposed at the other side of said memory cell, said odd numbered sense amplifiers being coupled to odd numbered bit lines and said even numbered sense amplifiers being coupled to said even numbered bit lines;
   a plurality of sub bit lines for coupling said sense amplifiers disposed at both sides of said memory cell array;
   voltage control circuits coupled to said sense amplifiers for restricting an amplitude of signal voltages appearing on said sub bit lines; and
   a pair of data busses coupled to said sub bit lines.

2. A semiconductor memory device of claim 1, further comprising a plurality of middle amplifiers coupled between said sub bit lines and said data busses.

3. A semiconductor memory device of claim 2, wherein each of said middle amplifiers is of a flip-flop type.

4. A semiconductor memory device of claim 2, wherein each of said middle amplifiers is of a current-mirror-type.

5. A semiconductor memory device of claim 1, further comprising a single middle amplifier coupled to said data busses.

6. A semiconductor memory device of claim 5, further comprising a switching circuit disposed between said middle amplifier and said sub bit lines.

7. A semiconductor memory device comprising;
   a memory cell array having a plurality of blocks, each block including a memory cell sub array, and sense amplifiers disposed at both sides of said memory cell sub array;
   a plurality of sub bit lines disposing over said plurality of blocks and coupled to said sense amplifiers in each block;

voltage control circuits coupled to said sense amplifiers for restricting an amplitude of signal voltages appearing on said sub bit lines;

a pair of data busses coupled to said sub bit lines;

a column decoder unit disposed at one side of said memory cell array; and a row decoder unit disposed at another side of said memory cell array.

* * * * *